United States Patent
Ravazzi et al.

(10) Patent No.: US 6,362,053 B1
(45) Date of Patent: Mar. 26, 2002

(54) FLOW PROCESS FOR PRODUCING NON-VOLATILE MEMORIES WITH DIFFERENTIATED REMOVAL OF THE SACRIFICIAL OXIDE

(75) Inventors: Leonardo Ravazzi, Dalmine; Carlo Severgnini, Torlino Vimercati; Piero Pansana, Muggio', all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/630,933

(22) Filed: Aug. 2, 2000

(30) Foreign Application Priority Data

Aug. 5, 1999 (IT) .......................................... MI99A1769

(51) Int. Cl.[7] ........................................... H01L 21/336
(52) U.S. Cl. ........................ 438/264; 438/260; 438/257
(58) Field of Search ................................. 438/265, 264, 438/260, 257, 263

(56) References Cited

U.S. PATENT DOCUMENTS 5,550,072 A * 8/1996 Cacharelis et al. ............ 437/43
5,943,262 A * 7/1999 Choi ...................... 365/185.17
6,207,505 B1 * 4/2001 Wu ............................. 438/264

* cited by examiner

Primary Examiner—Richard Elms
Assistant Examiner—Bradley Smith
(74) Attorney, Agent, or Firm—Wolfe, Greenfield & Sacks, P.C.; James H. Morris; John N. Anastasi

(57) ABSTRACT

Flow process for producing non-volatile memories with differentiated removal of the sacrificial oxide in the NO-DPCC diagram including a series of steps that permit the removal of the oxide in two distinct moments from the matrix area and from the circuitry area. In this manner the active circuitry areas are preserved from the danger of breaking the tunnel oxide, thus avoiding the degradation of the quality of the oxides and increasing, in addition, the level of reliability of the device itself.

16 Claims, 5 Drawing Sheets

FLOW PROCESS FOR PRODUCING NON-VOLATILE MEMORIES WITH DIFFERENTIATED REMOVAL OF THE SACRIFICIAL OXIDE

BACKGROUND OF THE INVENTION

1. Field of the Invention

The present invention relates to a process flow for producing non-volatile memories with differentiated removal of the sacrificial oxide, and in particular to an NO-DPCC (double short-circuited poly) process or for any memory device in which a first layer of polysilicon is removed.

2. Discussion of the Related Art

In the conventional process flow for producing non-volatile memory devices of the flash type, immediately after a step in which a field oxide is generated, after a step in which the layers suitable for forming the active areas (HARD MASK) are removed, after a step in which a thermal oxide about 300–500 A thick is generated and after a step in which implants of boron in the memory cells (EPM) in the matrix area have been made, this thermal oxide, also called sacrificial oxide, is completely removed by a blanket attack and with it also all the impurities and residues left from the previous operations. Therefore the sacrificial oxide is removed both from the area of the memory matrix and from the circuitry area.

In an NO-DPCC circuit, the flash memory cells consist of a first layer of polysilicon, called polyI, and a second layer of polysilicon, called polyII, isolated by a dielectric layer, called interpoly dielectric. After the formation of a tunnel oxide, of the polyI and the interpoly dielectric over the whole surface of the device, said layers must be completely removed from the circuitry area before the successive formation of the polyII.

A problem that can occur during the interpoly dielectric removal step and in particular of the polyI is that damage can be made, in the circuitry zone, of the area below, due to an overattack and a possible breaking of the tunnel oxide, caused, for example, by machine process imprecision.

In view of the state of the art described, an object of the present invention is to prevent this breaking of the tunnel oxide from occurring during the attack of the interpoly dielectric and the polyI.

SUMMARY OF THE INVENTION

According to the present invention, this and other objects are achieved by a process flow including the steps of:

(a) a step of growth of a layer of sacrificial oxide on a substrate of silicon on said matrix area and said circuitry area;

(b) a step in which a layer of sacrificial oxide is removed by means of an attack in said matrix area;

(c) a step of growth of a layer of tunnel oxide on said matrix area and said circuitry area;

(d) a step of deposition a first layer of polysilicon;

(e) a step of formation of a layer of interpoly dielectric after said first layer of polysilicon on said circuitry and matrix areas;

(f) a step of attack to said layer of dielectric in said circuitry;

(g) a step of attack to said first layer of polysilicon in said circuitry area;

(h) a step of attack to said layer of sacrificial oxide and on the tunnel oxide by means of a wet attack in said circuitry area.

Thanks to this invention such oxide can be removed in the circuitry area while protecting the layers below from any damage caused by attacks previously made without introducing any additional step to the memory cell implementation process. In this manner the active areas of the circuitry are protected from the danger of oxide breaking, thus avoiding the degradation of the quality of the circuitry oxides and, in addition, increasing the level of reliability of the device itself.

BRIEF DESCRIPTION OF THE DRAWINGS

The characteristics and the advantages of the present invention will be evident from the following detailed description of an embodiment thereof, illustrated as non-limiting example in the enclosed drawings, in which.

DETAILED DESCRIPTION

Figure 1:
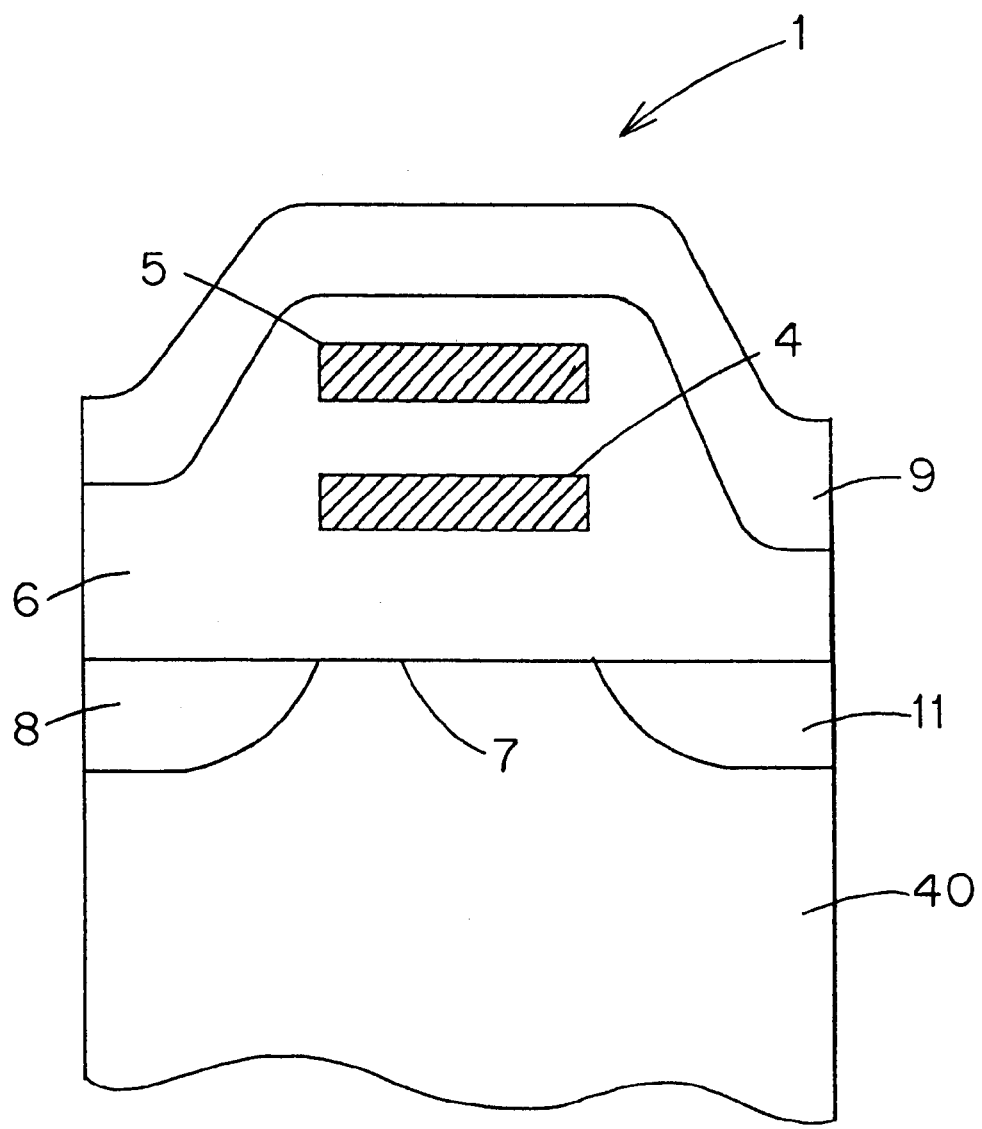
FIG. 1 shows a flash cell according to the known art.

In FIG. 1 a flash cell according to the known art is shown.

An NO-DPCC process is taken into consideration, according to which the cell of a non-volatile memory device, for example a flash cell 1, includes a p type substrate 40, in which a floating gate 4 is made in a first layer of polysilicon, polyI, where the charges are stored, and a control gate 5 is made in a second layer of polysilicon, polyII, said gates being isolated from each other by means of a layer of dielectric 6, called interpoly dielectric.

Moreover, we can note the presence of pockets 8 and 11, doped n+, can be noted suitable for forming the diffusion zones for drain electrodes 8 and source electrodes 11, and the presence of a line of metalization 9.

In addition, in said cell 1, there is a tunnel area 7, through which the electric charges pass, injected into the floating gate 4 from the channel that forms between the n+ doped pockets 8 and 11, by channel hot electron effect.

According to the flow diagram of an NO-DPCC process for producing a flash memory, after the formation of the tunnel area 7, of the floating gate 4 (polyI) and of the interpoly dielectric 6 over the entire surface of the device 1, the layers must be completely removed from the circuitry area before the successive formation of the control gate 5 (polyII). This removal is made by a mask, called matrix mask, which completely covers the matrix and leaves the circuitry uncovered and it is in this step that there is the risk of perforating the tunnel oxide, thus degrading the electric performance of the device.

In the present disclosure, the term matrix means the area of the chip dedicated to the memory region and the term circuitry means the area of the chip dedicated to the input/output circuits of the memory region.

Figure 2:
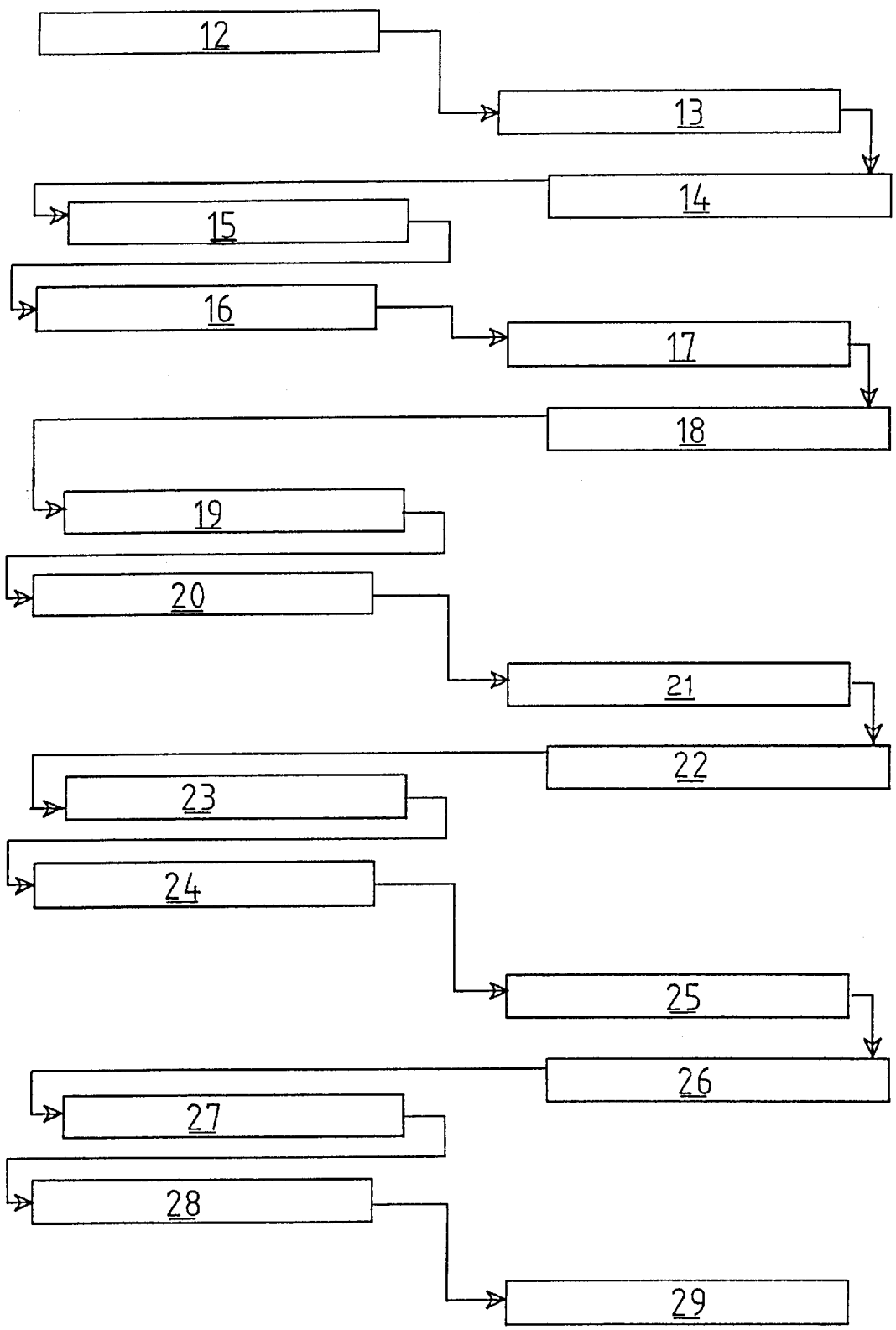
FIG. 2 illustrates a flow diagram of an NO-DPCC process according to the known art.

A flow diagram of an NO-DPCC process according to the known art is shown in FIG. 2.

Usually, according to such NO-DPCC diagram, the sacrificial oxide is completely removed from the entire surface of the device.

In fact after a first step 12 of growth of a layer of thermal oxide, also called sacrificial oxide, with a thickness of about 40 nm, step 13 is provided in which a mask (resist) is deposited for the formation of active areas on the matrix part. Successively, step 14 is carried out during which the ionic implantation occurs, resorting to an implant of boron atoms, to raise the threshold voltages of the memory cells.

At this point a step 15 is provided in which the resist is removed, that is a protective layer is removed, and a step 16 in which the sacrificial oxide is removed by a blanket attack in HF (hydrofluoric acid).

Then, a step 17 is provided during which the growth of a tunnel oxide with a thickness of about 10 nm occurs. Successively there is a deposition of a first layer of polysilicon, step 18.

During step 19 the application of a photolitographic mask is provided which is followed by a step 20 of selective attack and removal of said first layer of polysilicon and a step 21 of removal of the protective layer.

At this point, after the removal of the mask, deposited during step 19, a step 22 is provided in which the formation of a layer of dielectric occurs, preferably including a multilayer of ONO (Oxide-Nitride-Oxide), made at a low temperature by CVD deposition of nitride and silicon oxide. Then step 23 is carried out, in which said ONO dielectric is densified to make it less porous.

All the previous steps are carried out over the whole surface of the wafer, that is both on the matrix area and on the circuitry area.

Through a photolitographic mask, deposited during step 24, which covers the matrix area, step 25 of attack to said ONO dielectric layer is provided, step 26 of attack to said first layer of polysilicon and step 27 of attack to the tunnel oxide by means of a wet attack, for example by using a BOE (Buffered Oxide Etch) attack, well-known to technicians in the art, for a depth of about 18 nm so that the surface of the substrate of silicon below is not damaged.

The process steps 25, 26 and 27 are only carried out on the circuitry area.

In conclusion, provision is made for step 28 in which the layer of protective resist is removed and the operation flow proceeds until the device is completed, step 29.

One problem that could arise during the removal step, in particular during the removal of said first layer of polysilicon, step 26, and said layer of interpoly dielectric, step 25, is the damaging in the circuitry of the active areas below, due to an overattack and possible breaking of the tunnel oxide, leading to considerable degradation of the performances and reliability of the device.

Figure 3:
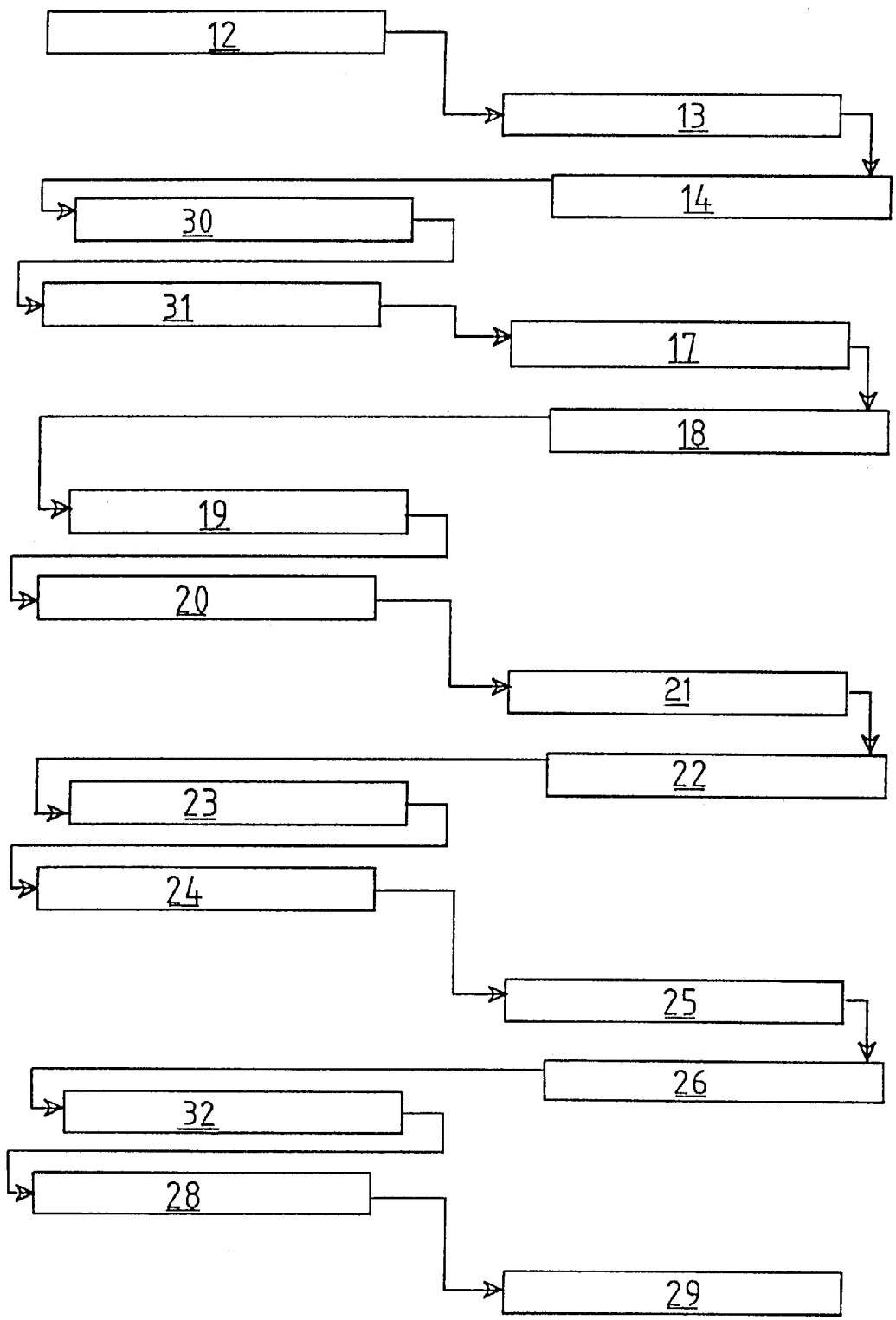
FIG. 3 shows a flow diagram of an NO-DPCC process according to the present invention.

FIG. 3 shows a flow diagram of an NO-DPCC process according to the present invention.

In this inventive flow diagram the attack of the sacrificial oxide is differentiated, that is the removal of the sacrificial oxide from the circuitry and matrix areas is carried out in two different steps, so that there is an additional protective layer during the removal steps 25 and 26.

The sacrificial oxide is removed from the matrix area after steps 12, 13 and 14 of the known process have been carried out, that is immediately after step 14 which provided the implants EMP1–EMP2 using the photolitgraphic mask, deposited during step 13. This implies that the mask for ionic implantation of boron atoms is removed only after the attack on the sacrificial oxide has been made, so that said oxide is eliminated only from the matrix area.

During step 30, suitably calibrating the attack, the same modifications of the oxide are obtained as those that the attack according to the known diagram would have produced.

Therefore, it can be derived that the sacrificial oxide remains integral in the circuitry zone and when the tunnel oxidation operation is carried out, successively, said tunnel oxide overlaps said sacrificial oxide making it thicker.

The inventive diagram proceeds following the same steps as those of the known diagram until it reaches the point in which after the attack on said first layer of polysilicon, step 26, there is a step 32 of attack to said sacrificial oxide and to said tunnel oxide through an attack preferably of BOE type for a depth of about 50–60 nm, thus eliminating the sacrificial oxide only from the circuitry area.

Therefore the sacrificial oxide is removed from the circuitry area after the attack of the first layer of polysilicon, step 26, during the tunnel oxide removal operation, step 32.

In this manner the sacrificial oxide, which has a thickness of about 40 nm, and the tunnel oxide, which has a thickness of about 10–20 nm, act as protection of the active area against overattack phenomena during the removal of said first layer of polysilicon, step 26. The fact of having a thicker oxide during said step 26 guarantees a factor of solidity which is definitely higher compared to the process of the known art. This means that also in the presence of an attack to said layer of polysilicon, step 26, or also of an attack to the ONO dielectric layer, step 25, whose thickness is extended beyond normal, the active circuitry areas and the quality of the circuitry oxides are conserved.

It is therefore evident that in the process diagram according to the invention neither additional masks, nor modifications to the existing masks, nor additional process steps are necessary.

The process according to the invention therefore can be used indifferently for any memory device that provides for the removal of the first layer of polysilicon in the circuitry.

In addition, the step sequence of the innovative process can be detected, as compared to the traditional process, because in the overlapping area of the two masks, deposited during steps 13 and 24, that is in the matrix border zone and typically on the field oxide, because of the intrinsic misalignment between the said two masks and as the attacks are carried out in two distinct steps, the presence of a rim can be observed, as the attack does not occur where the masks overlap, or the presence of an etching can be observed, as there is a double attack where the masks detached.

Figure 4:
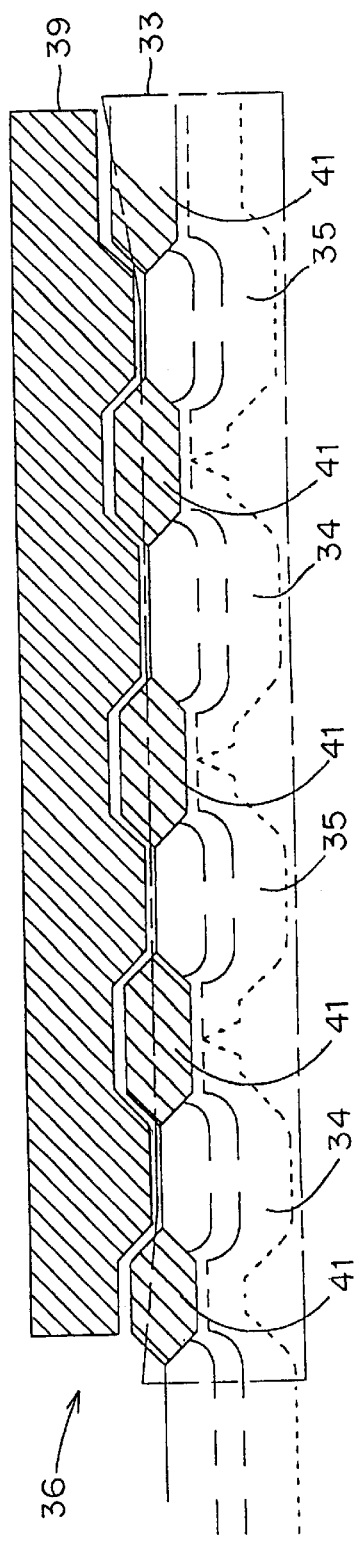
FIG. 4 illustrates a masking step of the process according to the invention.

FIG. 4 shows a masking step of the process according to the invention.

In such figure it can be noted that the photolithographic mask 39 of the device 36 is located on the circuitry area 33, in which an alternating of p type pockets 34 and n type pockets 35 and the presence of oxides 41 can be noted.

Said photolithographic mask 39 is the last mask before the ionic implantation of the boron atoms and therefore acts as a protective layer only for the circuitry part.

The attack to the sacrificial oxide during the presence of this mask and the removal of the layer of protective resist only from the matrix area is provided for by the flow according to the present invention.

Figure 5:
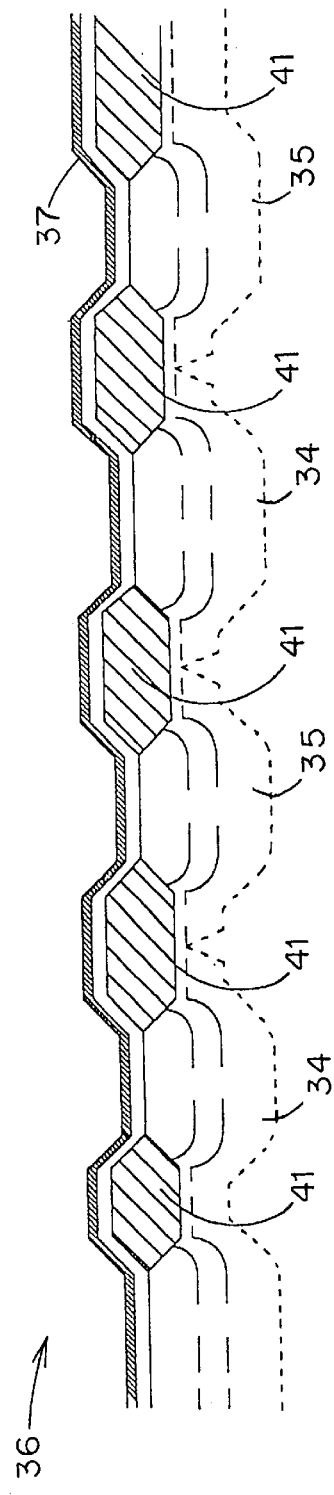
FIG. 5 shows a growth step of more than one layer of the process according to the invention.

FIG. 5 illustrates a growth step of several layers of the process according to the invention.

In such figure it can be noted that over the entire surface of the circuitry device 36, layers 37 of polysilicon and of dielectric are formed, through step 19 which provides for a masking process, and through step 17.

Figure 6:
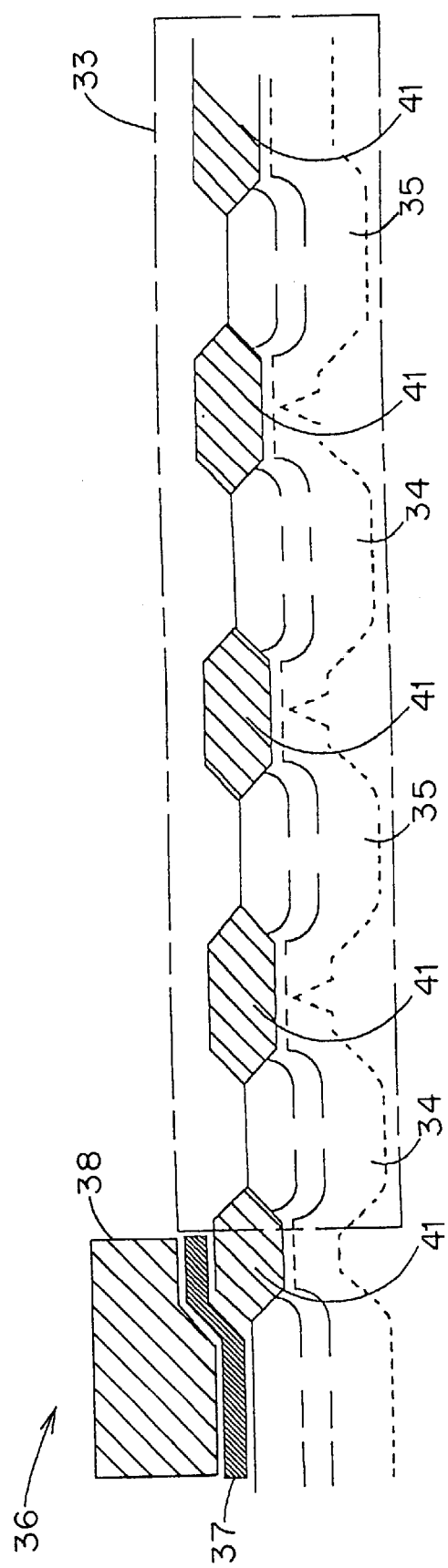
FIG. 6 illustrates a further masking step of the process according to the invention.

FIG. 6 shows a further masking step of the process according to the invention.

According to the illustration in such figure it can be noted that the part of the matrix area of the device 36 is covered by the "matrix" mask 38, which is positioned above the polysilicon and dielectric layers 37, leaving, therefore, uncovered the circuitry part 33.

In this situation, that is, when the mask protects the matrix area, the attack to the layer of interpoly dielectric, step, the attack to the first layer of polysilicon, step, and the removal of the sacrificial oxide and the tunnel oxide are made.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for producing non-volatile memories on a substrate of silicon having a matrix area comprising a memory cell area and a circuitry area comprising a control logic area, comprising the steps of:
   (a) growing a layer of sacrificial oxide on said substrate of silicon on said matrix area and on said circuitry area;
   (b) removing said layer of sacrificial oxide from said matrix area and leaving the sacrificial oxide on the circuitry area;
   (c) growing a layer of tunnel oxide on said matrix area and said circuitry area;
   (d) depositing a first layer of polysilicon on said matrix area and on said circuitry area;
   (e) forming a layer of interpoly dielectric, after said step of depositing said first layer of polysilicon, on said matrix area and said circuitry area;
   (f) removing said layer of interpoly dielectric from said circuitry area;
   (g) removing said first layer of polysilicon from said circuitry area;
   (h) removing said layer of sacrificial oxide and said layer of tunnel oxide from said circuitry area.

2. The process for producing non-volatile memories according to claim 1, wherein said step of removing said layer of sacrificial oxide and said layer of tunnel oxide comprises removing said sacrificial oxide and said tunnel oxide with a buffered oxide etch.

3. The process for producing non-volatile memories according to claim 1, wherein said step of removing said layer of sacrificial oxide from said matrix area comprises removing said layer of sacrificial oxide from said matrix area with a buffered oxide etch.

4. The process for producing non-volatile memories according to claim 1, wherein a thickness of said sacrificial oxide layer is about 40–50 nm and a thickness of said tunnel oxide layer is about 10–20 nm.

5. The process for producing non-volatile memories according to claim 1, wherein the step of removing said sacrificial oxide layer from said matrix area comprises using a mask to protect said circuitry area and to operate on said matrix area.

6. The process for producing non-volatile memories according to claim 1, wherein the steps of removing said interpoly dielectric layer, said first polysilicon layer, said tunnel oxide layer, and said sacrificial oxide layer from said circuitry area comprise using a mask to protect said matrix area and to operate on said circuitry area.

7. The process for producing non-volatile memories according to claim 1, wherein the step of removing said layer of sacrificial oxide and said layer of tunnel oxide comprises removing said layers sequentially.

8. A method for producing non volatile memories on a semiconductor substrate having a memory cell area and a control logic area, comprising the steps of:
   (a) growing a layer of sacrificial oxide on the memory cell area and on the control logic area;
   (b) removing the layer of sacrificial oxide from the memory cell area and leaving the layer of sacrificial oxide on the control logic area;
   (c) growing a layer of tunnel oxide on the memory cell area and on the control logic area;
   (d) depositing a first layer of polysilicon on the memory cell area and on the control logic area;
   (e) forming a layer of interpoly dielectric on the memory cell area and on the control logic area;
   (f) removing the layer of interpoly dielectric from the control logic area;
   (g) removing the first layer of polysilicon from the control logic area;
   (h) sequentially removing the layer of sacrificial oxide and the layer of tunnel oxide from the control logic area.

9. The method according to claim 8, wherein the step of removing the layer of sacrificial oxide and the layer of tunnel oxide comprises removing the layers from the control logic area with a buffered oxide etch.

10. The method according to claim 8, wherein the step of removing the layer of sacrificial oxide comprises removing the layer from the memory cell area with a buffered oxide etch.

11. The method according to claim 8, wherein the step of growing the sacrificial oxide layer comprises growing the sacrificial oxide layer with a thickness of about 40–50 nm and wherein the step of growing the tunnel oxide layer comprises growing the tunnel oxide layer with a thickness of about 10–20 nm.

12. The method according to claim 8, wherein the step of removing the sacrificial oxide layer from the memory cell area comprises using a mask which protects the control logic area and allows operation on the memory cell area.

13. The method according to claim 8, wherein the steps of removing the interpoly dielectric layer, the first polysilicon layer, the tunnel oxide layer, and the sacrificial oxide layer from the control logic area comprise using a mask which protects the memory cell area and allows operation on the control logic area.

14. The method according to claim 8, further comprising the step of protecting the substrate from overetch with the sacrificial oxide layer and the tunnel oxide layer during the removal of the first polysilicon layer from the control logic area.

15. The method according to claim 8, further comprising the step of protecting the substrate from overetch with the sacrificial oxide layer during the removal of the tunnel oxide layer from the control logic area.

16. The method according to claim 8, wherein the step of forming the layer of interpoly dielectric includes forming a multilayer Oxide-Nitride-Oxide.

* * * * *